United States Patent
Chao et al.

(10) Patent No.: US 10,680,568 B2
(45) Date of Patent: Jun. 9, 2020

(54) SOUND SIGNAL DETECTION DEVICE

(71) Applicant: Unlimiter MFA Co., Ltd., Eden Island (SC)

(72) Inventors: Kuan-Li Chao, Taipei (TW); Kuo-Ping Yang, Taipei (TW); Neo Bob Chih-Yung Young, Taipei (TW)

(73) Assignee: UNLIMITER MFA CO., LTD., Eden Island (SC)

( * ) Notice: Subject to any disclaimer, the term of this patent is extended or adjusted under 35 U.S.C. 154(b) by 0 days.

(21) Appl. No.: 15/726,481

(22) Filed: Oct. 6, 2017

(65) Prior Publication Data

US 2018/0262174 A1 Sep. 13, 2018

(30) Foreign Application Priority Data

Mar. 9, 2017 (TW) .............................. 106107796 A

(51) Int. Cl.
| | |
|---|---|
| *H03G 3/20* | (2006.01) |
| *H03G 3/32* | (2006.01) |
| *H04R 29/00* | (2006.01) |
| *H03G 5/02* | (2006.01) |
| *H03G 3/30* | (2006.01) |
| *H03G 3/00* | (2006.01) |
| *H03G 5/16* | (2006.01) |

(52) U.S. Cl.
CPC ............. *H03G 3/32* (2013.01); *H03G 3/3005* (2013.01); *H03G 5/025* (2013.01); *H04R 29/001* (2013.01); *H03G 5/165* (2013.01); *H04R 2430/01* (2013.01)

(58) Field of Classification Search
CPC ........ H03G 3/32; H03G 5/165; H03G 3/3005; H03G 5/025; H04R 29/001; H04R 2430/01
USPC .................. 381/57, 74, 104–109, 86, 58, 59
See application file for complete search history.

(56) References Cited

U.S. PATENT DOCUMENTS

| | | | |
|---|---|---|---|
| 2008/0130906 A1* | 6/2008 | Goldstein | A61B 5/121 381/58 |
| 2010/0005953 A1* | 1/2010 | Kemmochi | H03G 3/32 84/633 |
| 2012/0051560 A1* | 3/2012 | Sanders | H03G 1/02 381/105 |

(Continued)

OTHER PUBLICATIONS (https://web.archive.org/web/20150803152106/http://www.cablestogo.com/learning/connector-guides/usb). (Year: 2015).*

(Continued)

*Primary Examiner* — Ammar T Hamid
(74) *Attorney, Agent, or Firm* — Bacon & Thomas, PLLC

(57) ABSTRACT

A sound signal detection device is closed. The sound signal detection device is connected between an audio output device and a speaker apparatus. The sound signal detection device includes a first connecting port, a second connecting port, a microphone, and a processing module. The first connecting port connects to the audio output device and acquires a first sound signal. The second connecting port is used for outputting the first sound signal to the speaker apparatus. The microphone is used for receiving a second sound signal from the speaker apparatus. The process module is electrically connected to the microphone and used for detecting a volume of the second sound signal to generate a real volume signal.

8 Claims, 4 Drawing Sheets

(56) References Cited

U.S. PATENT DOCUMENTS

2014/0010378 A1* 1/2014 Voix ..................... H04R 1/1083
                                                            381/57
2015/0263688 A1* 9/2015 Nicolino, Jr. ............ H03G 3/32
                                                            381/57
2017/0371681 A1* 12/2017 Kulkarni ............... G06F 13/382

OTHER PUBLICATIONS (https://web.archive.org/web/20150803152106/http://www.cablestogo.com/learning/connector-guides/usb) (Year: 2015).*

* cited by examiner

SOUND SIGNAL DETECTION DEVICE

BACKGROUND OF THE INVENTION

1. Field of the Invention

The present invention relates to a sound signal detection device; more particularly, the present invention relates to a sound signal detection device capable of automatically detecting a real volume of a generated sound signal.

2. Description of the Related Art

In modern life, people often use smart phones to listen to music or watch videos, and wear earphones to achieve better audio effect. However, the earphone causes more impact to the user's hearing, and it would easily result in hearing damage if the volume is continuously and excessively loud. Therefore, a method of automatically controlling the volume has been developed. However, the conventional method of automatically controlling the volume of the earphone is possibly implemented by using a smart phone to adjust the volume of a sound signal, but it is also possible that the user uses a control key or knob on the earphone to adjust the volume of the sound signal. As a result, the volume of the sound generated by the smart phone and the volume of the sound generated by the earphone are different. If the volume is adjusted only based on the sound generated by the smart phone, it is very likely that the volume does not reflect the real volume. Further, if the earphone is directly put close to the microphone of the smart phone for detecting the real volume, it would easily cause the sound signal to be continuously fed back and amplified so as to generate a sharp feedback sound, which is inconvenient to the user.

Therefore, there is a need to provide a sound signal detection device to mitigate and/or obviate the aforementioned problems.

SUMMARY OF THE INVENTION

It is an object of the present invention to provide a sound signal detection device, which can automatically detect a real volume of a generated sound signal.

To achieve the abovementioned object, the sound signal detection device of the present invention is connected between an audio output device and a speaker apparatus. The sound signal detection device comprises a first connecting port, a second connecting port, a microphone and a processing module. The first connecting port is connected to the audio output device, used for acquiring a first sound signal generated by the audio output device. The second connecting port is connected to the speaker apparatus, used for outputting the first sound signal to the speaker apparatus. The microphone is used for receiving a second sound signal outputted from the speaker apparatus. The processing module is electrically connected to the microphone, used for detecting a volume of the second sound signal to generate a real volume signal.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
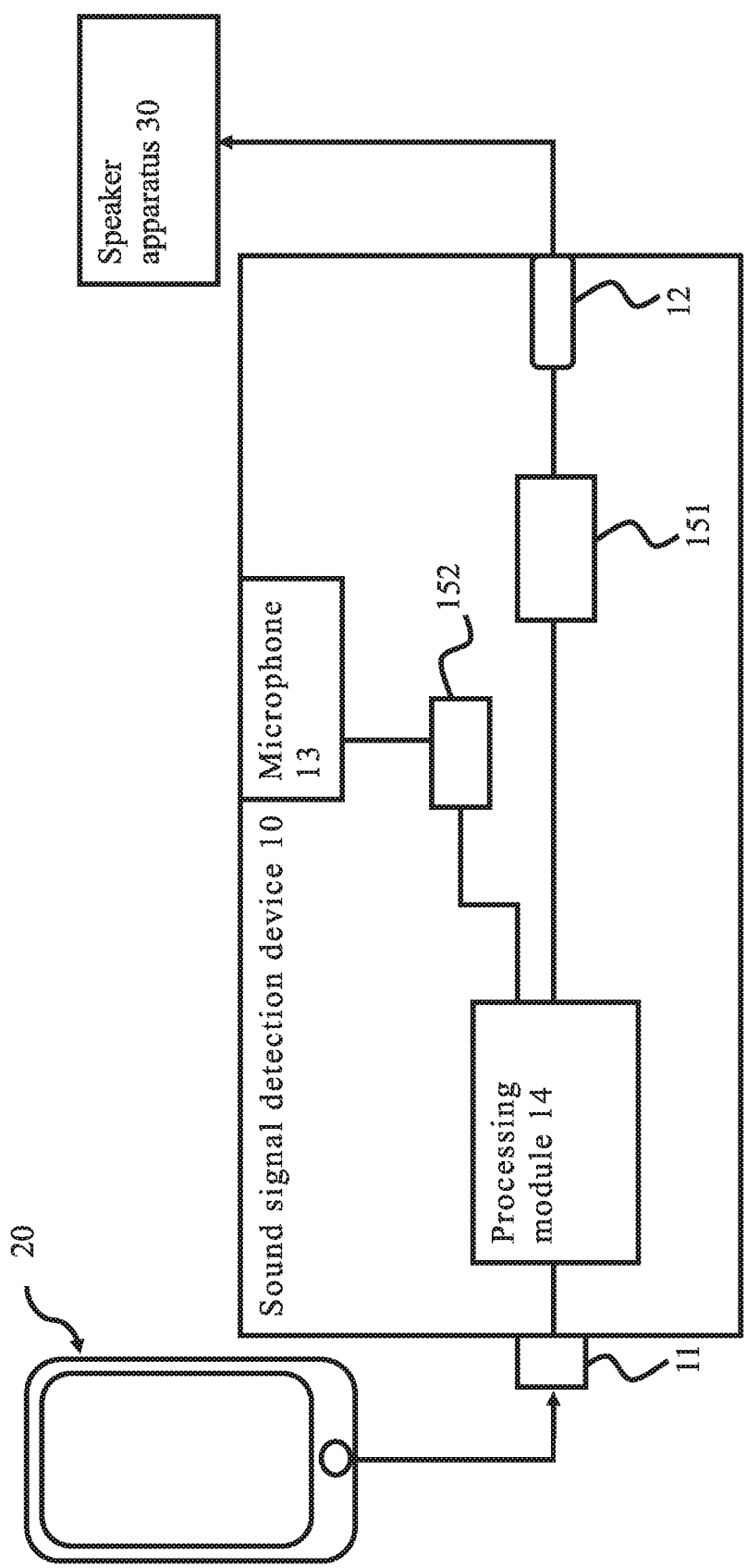
FIG. 1 illustrates a structural schematic drawing of a sound signal detection device according to the present invention.

Please refer to FIG. 1, which illustrates a structural schematic drawing of a sound signal detection device according to the present invention.

The sound signal detection device 10 of the present invention is connected between an audio output device 20 and a speaker apparatus 30, and is used for detecting a sound signal generated by the speaker apparatus 30, as well as for returning a detection result to the audio output device 20. According to one embodiment of the present invention, the audio output device 20 can be a smart phone, a tablet computer, a laptop computer or any device that can output sound signals; and the speaker apparatus 30 can be a speaker, an earphone or any device that can generate a sound; however, please note the scope of the present invention is not limited to the above listed devices.

According to one embodiment of the present invention, the sound signal detection device 10 comprises a first connecting port 11, a second connecting port 12, a microphone 13, a processing module 14, a digital-to-analog conversion module 151 and an analog-to-digital conversion module 152. The first connecting port 11 can be a USB Type-C adapter or a Bluetooth module for being connected to the audio output device 20, so as to acquire a first sound signal generated by the audio output device 20. Because the audio output device 20 is also equipped with a corresponding USB Type-C connecting port or a Bluetooth module, it can be connected to the first connecting port 11, and therefore the audio output device 20 would output the first sound signal in a digital form. The second connecting port 12 is connected to the speaker apparatus 30, so as to output the first sound signal to the speaker apparatus 30. The first sound signal can be, but not limited to, at a fixed volume, at a continuously changing volume, or at a fixed volume with a continuously changing frequency. The second connecting port 12 can output the first sound signal in either an analog form or a digital form to the speaker apparatus 30. Then, the speaker apparatus 30 can generate a second sound signal.

The microphone 13 is used for receiving the second sound signal outputted from the speaker apparatus 30, and for transmitting the second sound signal to the processing module 14, such that the processing module 14 determines a volume of the second sound signal to generate a real volume signal, and then returns the real volume signal to the audio output device 20 via the first connecting port 11. Because the audio output device 20 only receives the processed real volume signal, the second sound signal received by the microphone 13 would not be directly generated by the speaker apparatus 30. Therefore, no feedback sound would be generated. The audio output device 20 can further determine whether the real volume signal exceeds a predetermined threshold. The predetermined threshold can be 100 dB without limiting the scope of the present invention. Because the adjustment process of the audio output device 20 is not the major improvement of the present invention, there is no need for further description.

The sound signal detection device 10 can also include a digital-to-analog conversion module 151 and an analog-to-digital conversion module 152. The first connecting port 11 can convert the digital first sound signal into an analog signal via the digital-to-analog conversion module 151. After the microphone 13 receives the analog second sound signal, it can also utilize the analog-to-digital conversion module 152 to convert the analog second sound signal into a digital signal for being transmitted to the processing module 14. Because the analog or digital conversion can be carried out depending on the standard of the input or output connecting port, the scope of the present invention is not limited to the above conversion examples.

Figure 2:
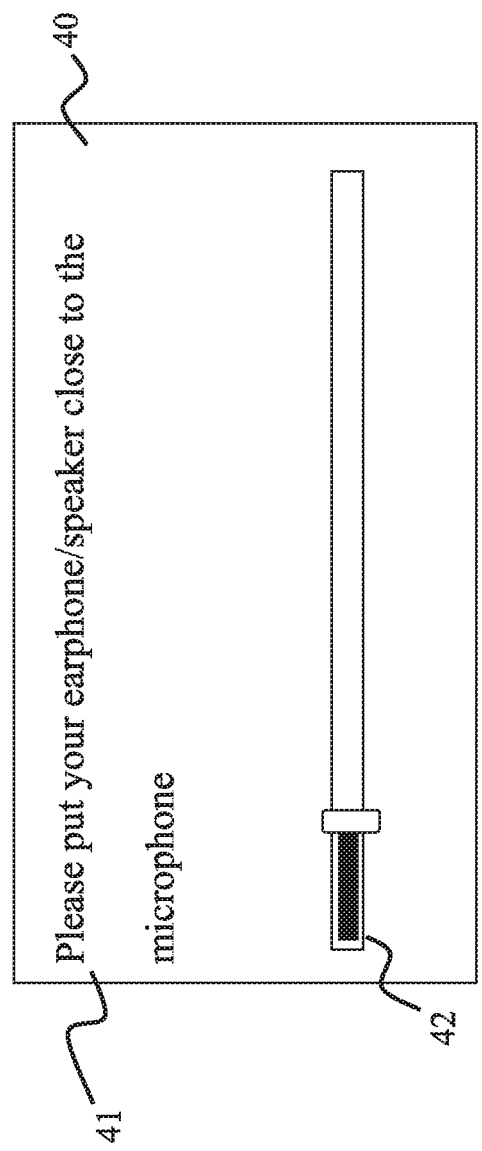
FIG. 2 illustrates a schematic drawing of detecting a sound signal according to the present invention.

Next, please refer to FIG. 2, which illustrates a schematic drawing of detecting a sound signal according to the present invention.

The processing module 14 can firstly makes the audio output device 20 to display an instruction screen 40. The instruction screen 40 can display instruction text 41 and a progress bar 42, so that a user can follow instructions to put the speaker apparatus 30 close to the microphone 13 to carry out volume adjustment.

For example, the instruction text 41 can display "Please put your earphone/speaker close to the microphone", and the audio output device 20 or the processing module 14 can output the first sound signal from a minimum volume to a maximum volume, such that the microphone 13 can continuously receive the second sound signal at different volumes. After the progress bar 42 completes, a continuous volume change of the second sound signal can be obtained. For example, the processing module 14 can detect and obtain the following look-up table:

| Volume of the first sound signal | Volume of the second sound signal |
|---|---|
| 0 | 0 |
| 1 | 1 |
| 2 | 2 |
| 3 | 2 |
| 4 | 3 |
| 5 | 3 |
| 6 | 4 |
| 7 | 4 |
| 8 | 5 |
| 9 | 5 |

Accordingly, after the speaker apparatus 30 performs adjustment, the volume of the first sound signal and the volume of the second sound signal are not completely the same. Therefore, the processing module 14 can obtain the real volume signal generated by the speaker apparatus 30, and the processing module 14 can further returns the real volume signal to the audio output device 20 via the first connecting port 11, so that the audio output device 20 can perform other follow-up audio signal processing.

Figure 3:
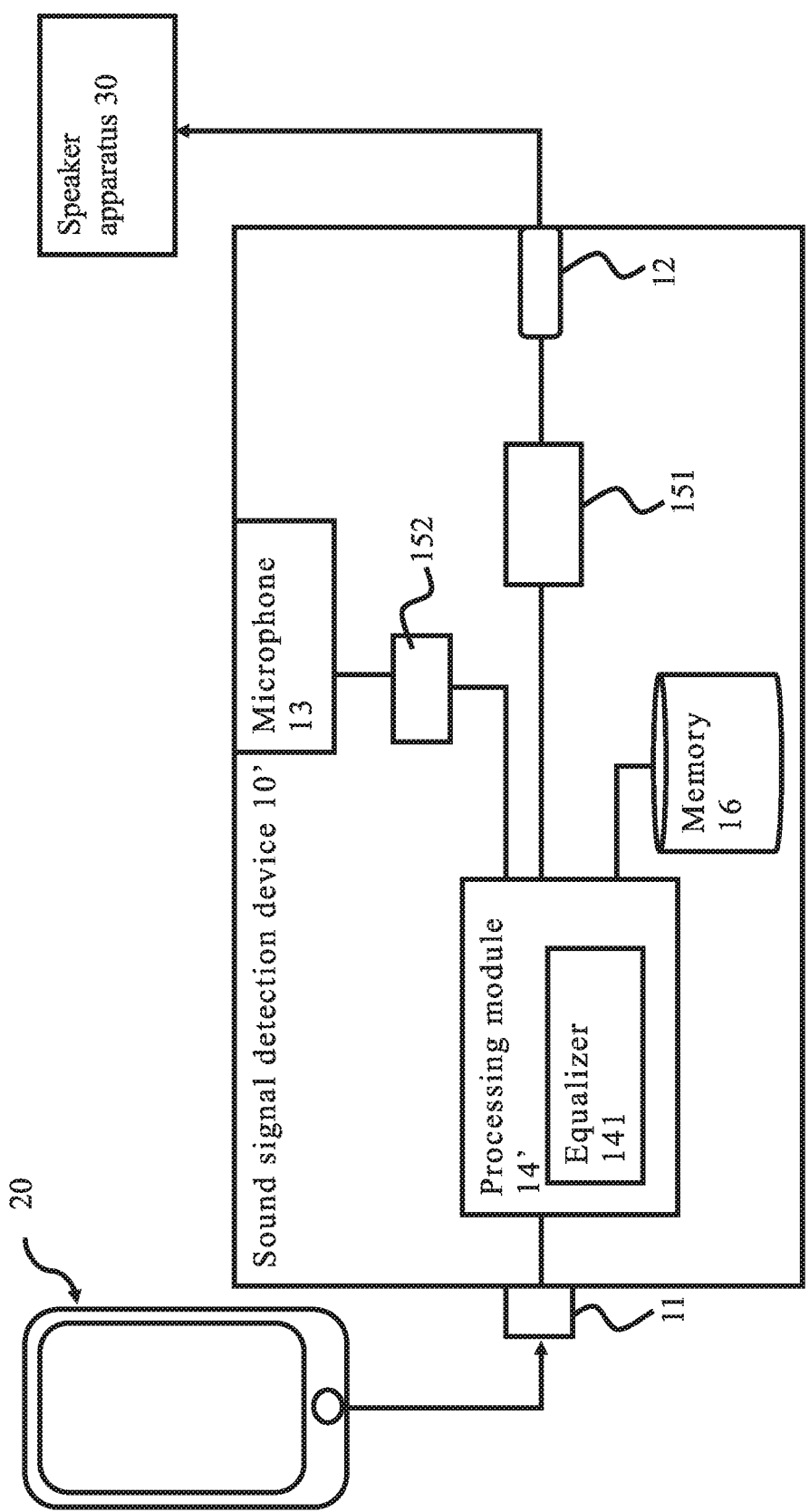
FIG. 3 illustrates a structural schematic drawing of the sound signal detection device according to another embodiment of the present invention.

Then, please refer to FIG. 3, which illustrates a structural schematic drawing of the sound signal detection device according to another embodiment of the present invention.

Figure 4:
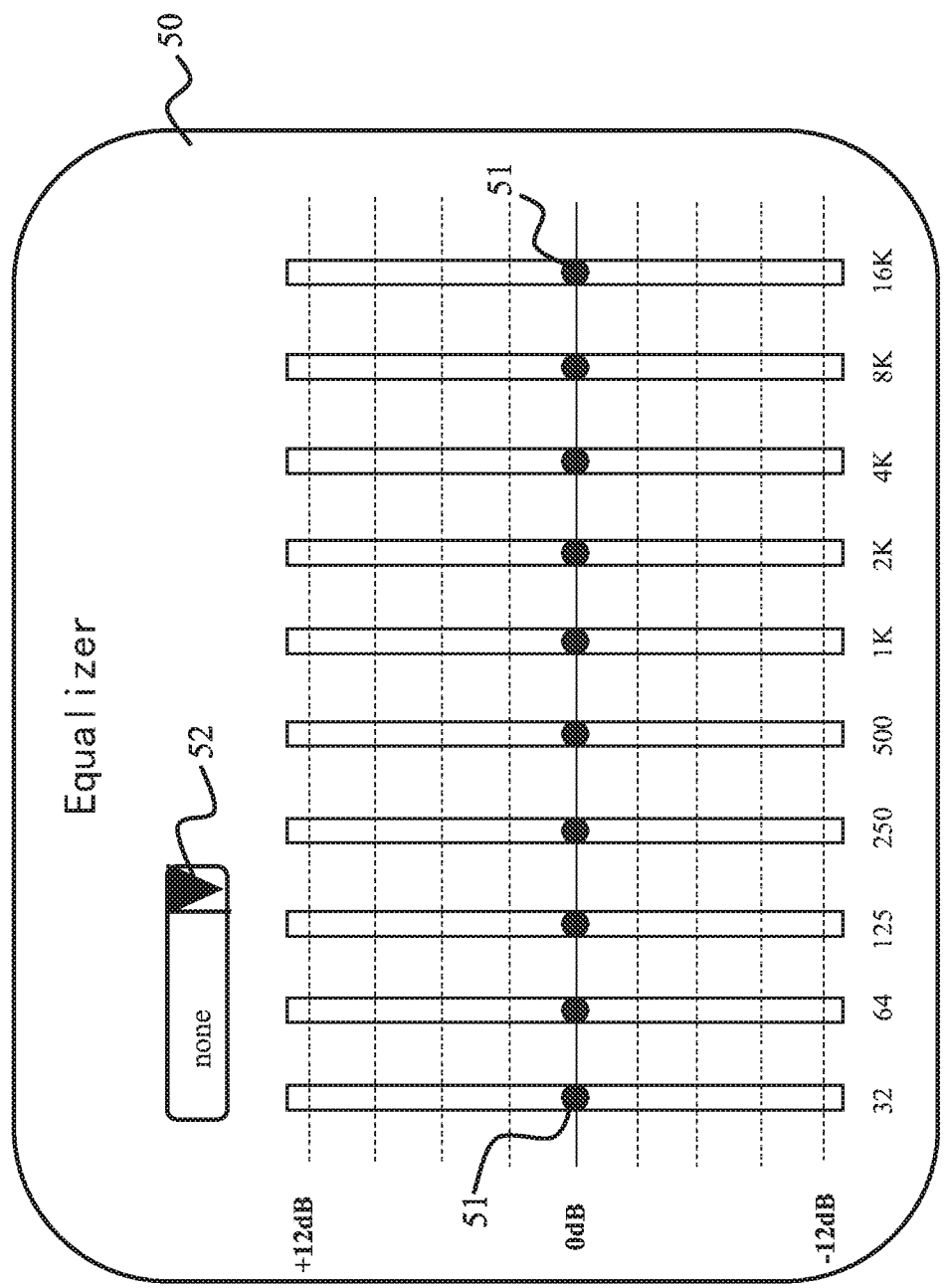
FIG. 4 illustrates a schematic drawing of an equalizer in use according to the present invention.

Because the real volume signal generated by the speaker apparatus 30 is obtained, the present invention can carry out precise adjustment to the first sound signal. Therefore, according to another embodiment of the present invention, the processing module 14' of the sound signal detection device 10' further comprises an equalizer (EQ) 141. The equalizer 141 is a tool for tuning sound output, in order to change a gain value of the sound at different frequency bands; therefore it is often used for adjusting outputted audio effect. According to one embodiment of the present invention, the user can utilize a graphical user interface 50 as shown in FIG. 4 to conduct settings. Please refer to FIG. 4, which illustrates a schematic drawing of an equalizer in use according to the present invention. The equalizer 141 can display an adjustment screen on a display of the audio output device 20, so that the user can set up the gain values of the sound at different frequency bands. In a normal mode, the gain values of the sound at each frequency are the same. If the user desires to increase the frequency of the first sound signal, the user can manually increase the gain values of high frequency portions (2K~16 KHz) via control buttons 51. Besides, the equalizer 141 is provided with multiple modes for user selection, therefore the user can select a desired mode via a mode menu 52, so as to adjust the gain values of the first sound signal at different frequency bands, thereby changing the audio effect of an outputted sound. Because the equalizer 141 is a common sound output adjustment tool, its structure and operating principle is well known by those skilled in the related art, there is no need for further description. Moreover, the present invention is not limited to carry out adjustment by the sound signal detection device 10', the adjustment can also be done by the audio output device 20.

The sound signal detection device 10' of the present invention can further include a memory 16 used for storing a user parameter. The processing module 14' can access the user parameter to adjust the to-be-outputted first sound signal, so as to adapt to different user behaviors and habits. For example, after the user selects a desired mode via the mode menu 52, the memory 16 can store the corresponding user parameter, and the processing module 14' can access it later.

Please note that each of the modules of the sound signal detection device 10 or 10' can be a hardware device, a software program combined with a hardware device, a firmware combined with a hardware device or a combination thereof without limiting the scope of the present invention. For example, the present invention can be accomplished by accessing a computer program product stored in a memory. However, the scope of the present invention is not limited to the above description. Furthermore, embodiments disclosed herein are only preferred embodiments as examples for describing the present invention, in order to avoid redundant expressions, not all possible variations and combinations are described in details in this specification. However, those skilled in the art would understand the above modules or components are not all necessary parts; or, in order to implement the present invention, other more detailed known modules or components might also be included. It is possible that each module or component can be omitted or modified depending on different requirements; and it is also possible that other modules or components might be disposed between any two modules.

As a result, the sound signal detection device 10 or 10' can detect the real volume generated by the speaker apparatus 30. Also, the feedback sound can be avoided, such that the sound signal detection device 10 or 10' or the audio output device 20 can perform follow-up adjustment to achieve better hearing protection effect Although the present invention has been explained in relation to its preferred embodiments, it is to be understood that many other possible modifications and variations can be made without departing from the spirit and scope of the invention as hereinafter claimed.

What is claimed is:

1. A sound signal detection device, connected between an audio output device and a speaker apparatus, the sound signal detection device comprising:
    a first connecting port, connected to the audio output device, for acquiring a first sound signal from a minimum volume to a maximum volume generated by the audio output device;
    a second connecting port, connected to the speaker apparatus, for outputting the first sound signal from the minimum volume to the maximum volume to the speaker apparatus to make the speaker apparatus to output a second sound signal;
    a microphone, used for receiving the second sound signal outputted from the speaker apparatus; and
    a processing module, electrically connected to the microphone, used for making the audio output device to output the first sound signal from the minimum volume to the maximum volume and detecting a continuous volume of the second sound signal to obtain a real volume signal generated by the audio output device.

2. The sound signal detection device as claimed in claim 1, wherein the first sound signal is a digital signal, and the second sound signal is an analog signal, where the sound signal detection device further comprises:
    a digital-to-analog conversion module, electrically connected to the processing module, used for converting the digital first sound signal into an analog sound signal; and
    an analog-to-digital conversion module, electrically connected to the processing module, used for converting the analog second sound signal into a digital sound signal.

3. The sound signal detection device as claimed in claim 2, wherein the processing module further returns the real volume signal to the audio output device via the first connecting port.

4. The sound signal detection device as claimed in claim 1, wherein the processing module further comprises an equalizer, used for adjusting a gain value of the first sound signal at each frequency band.

5. The sound signal detection device as claimed in claim 4, further comprising a memory, used for storing a user parameter, wherein the processing module accesses the user parameter to adjust the first sound signal.

6. The sound signal detection device as claimed in claim 1, wherein the first connecting port is a USB Type-C adapter.

7. The sound signal detection device as claimed in claim 1, wherein the processing module further returns the real volume signal to the audio output device via the first connecting port.

8. The sound signal detection device as claimed in claim 1, further comprising a memory, used for storing a user parameter, wherein the processing module accesses the user parameter to adjust the first sound signal.

* * * * *